United States Patent [19]

Kruger, Jr.

[11] Patent Number: 4,898,748
[45] Date of Patent: Feb. 6, 1990

[54] METHOD FOR ENHANCING CHEMICAL REACTIVITY IN THERMAL PLASMA PROCESSES

[75] Inventor: Charles H. Kruger, Jr., Stanford, Calif.

[73] Assignee: The Board of Trustees of Leland Stanford Junior University, Stanford, Calif.

[21] Appl. No.: 239,122

[22] Filed: Aug. 31, 1988

[51] Int. Cl.$^4$ .................................................. B05D 3/06
[52] U.S. Cl. ..................................... 427/38; 427/53.1; 427/54.1
[58] Field of Search ..................... 427/38, 54.1, 53.1

[56] References Cited

U.S. PATENT DOCUMENTS

| | | | |
|---|---|---|---|
| 3,903,891 | 4/1975 | Brayshaw | 128/303.14 |
| 4,434,188 | 1/1984 | Kamo et al. | 427/39 |
| 4,505,947 | 3/1985 | Vukanovic et al. | 427/34 |
| 4,717,622 | 2/1988 | Kurokawa et al. | 428/408 |
| 4,745,338 | 2/1988 | Hollis, Jr. et al. | 315/111.71 |
| 4,816,113 | 3/1989 | Yamazaki | 156/643 |

OTHER PUBLICATIONS

Matsumoto et al., "Deposition of Diamond in a RF Induction Plasma", *Symposium Proceedings*, vol. 4, ISPC/Tokyo, Aug. 31–Sep. 4, 1987, pp. 2458–2462.
Kruger, "Nonequilibrium Effects in Thermal Plasma Chemistry", paper presented on Aug. 31, 1987 in Tokyo.
Emmons, "Arc Measurement of High-Temperature Gas Transport Properties", *The Physics of Fluids*, vol. 10, No. 6, Jun. 1967, pp. 1125–1136.
Kruger, "Nonequilibrium in Confined-Arc Plasmas", *The Physics of Fluids*, vol. 13, No. 7, Jul. 1970, pp. 1737–1746.

*Primary Examiner*—Bernard Pianalto
*Attorney, Agent, or Firm*—Majestic, Parsons, Siebert & Hsue

[57] ABSTRACT

A method for enhancing a chemical reaction is provided by forming a plasma that includes at least one multiatomic reactant, flowing the plasma into a reaction zone, and then elevating an electron temperature of the plasma by at least about 1,000° Kelvin. The elevated electron temperature increases the dissociation of the multiatomic reactant in the plasma and/or inhibits recombination of the multiatomic reactant when dissociated. The method may be practiced to enhance the chemical vapor deposition of materials such as silicon and diamond.

16 Claims, 3 Drawing Sheets

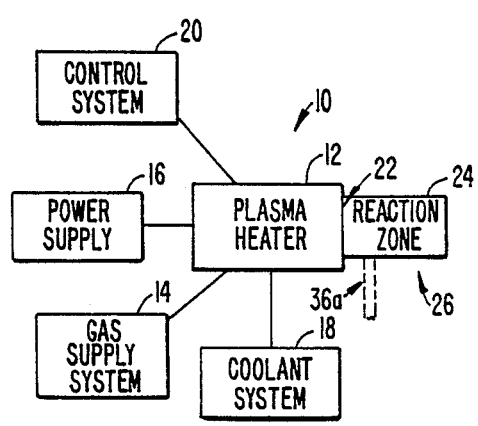
FIG._1.
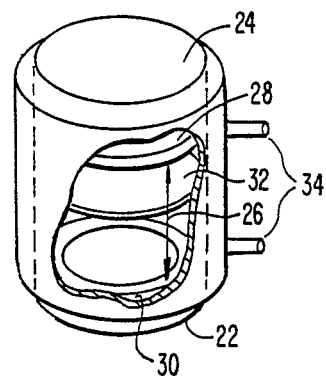
FIG._2.
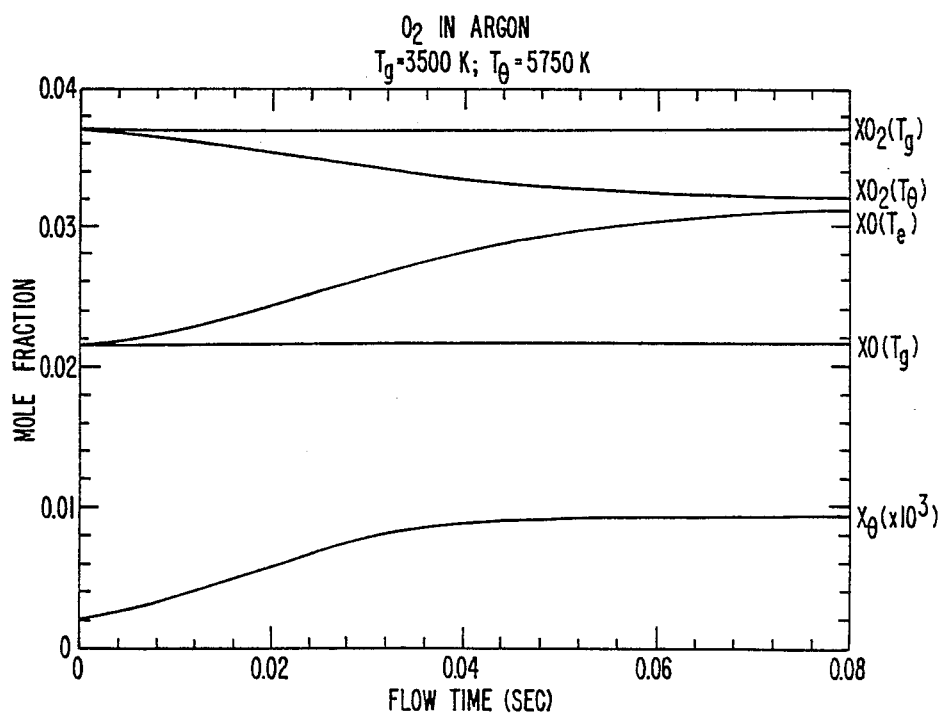
FIG._3.

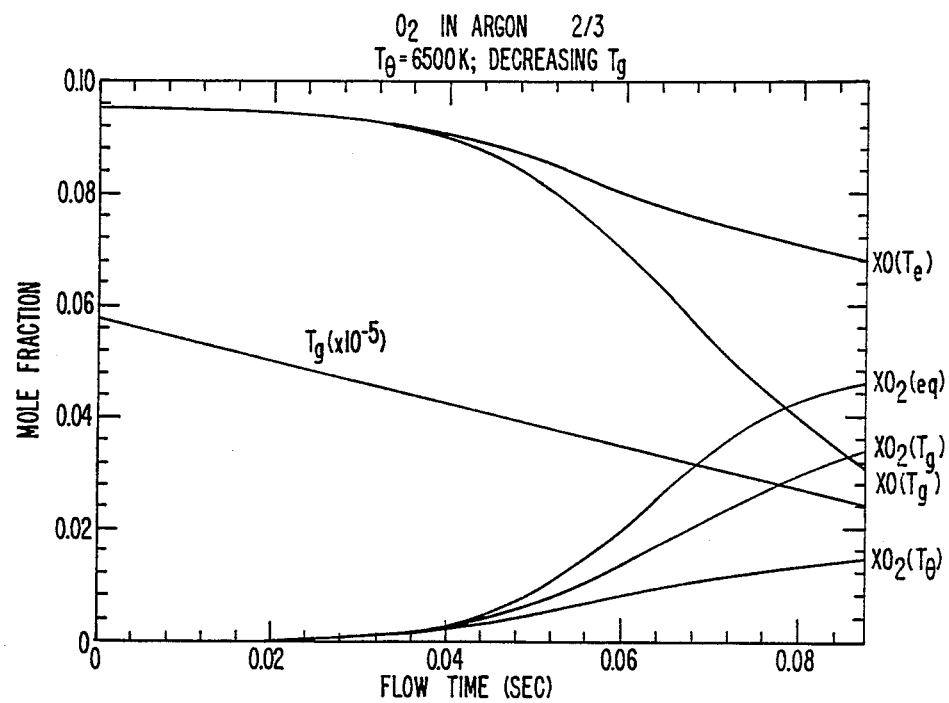
FIG._4.
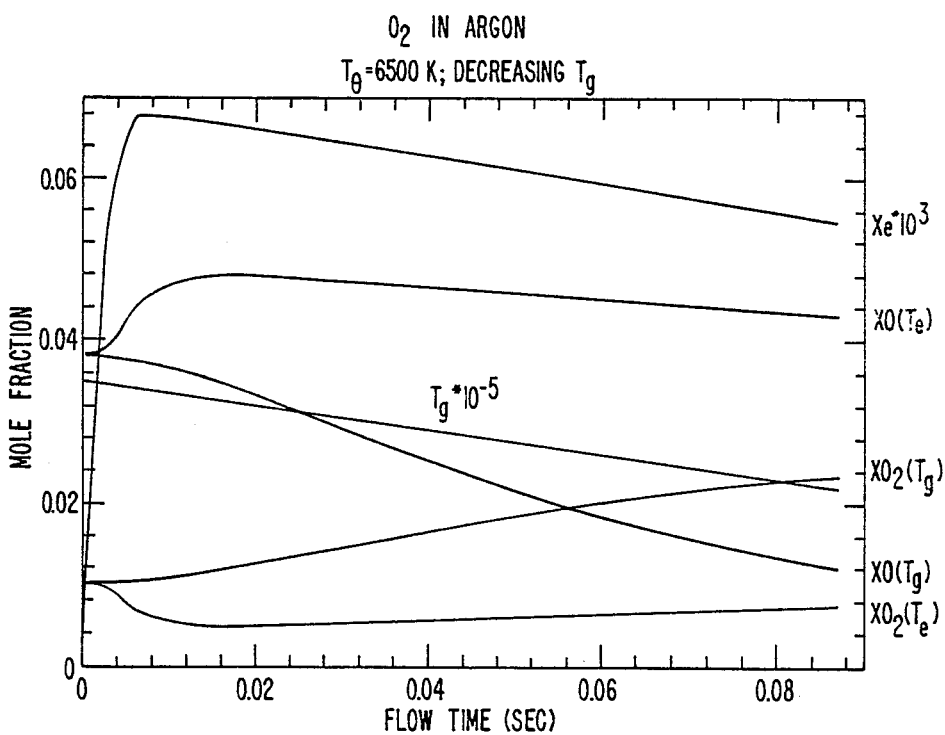
FIG._5.

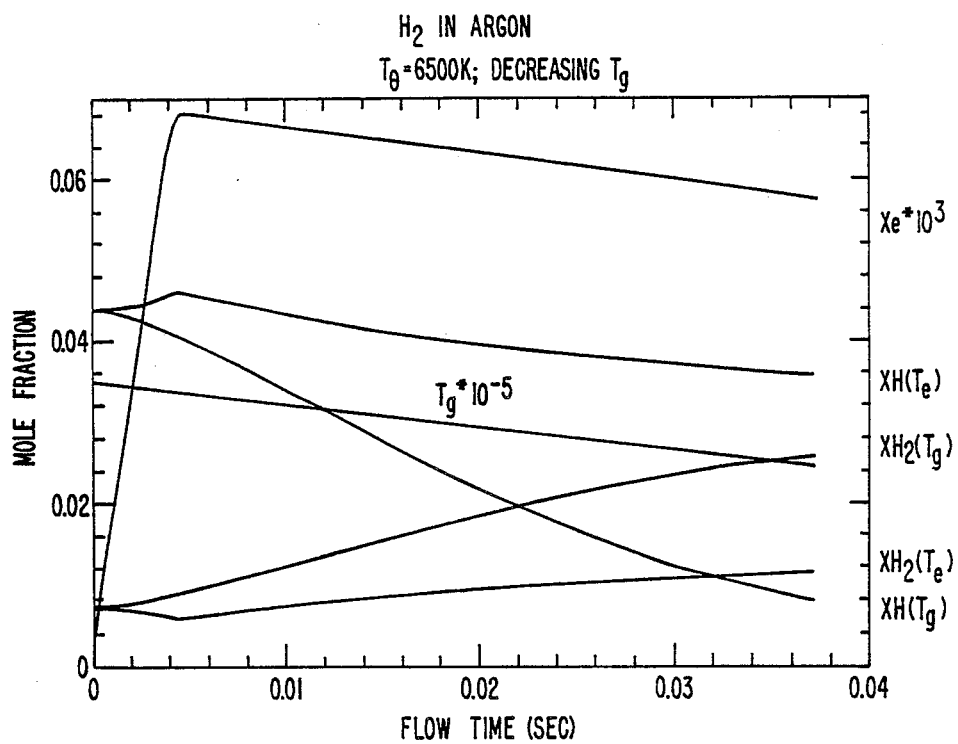
FIG._6.

METHOD FOR ENHANCING CHEMICAL REACTIVITY IN THERMAL PLASMA PROCESSES

FIELD OF THE INVENTION

The present invention generally relates to plasma processes, and more particularly to plasma enhanced chemical vapor depositions where chemical reactions conducted in plasmas have a multiatomic reactant that dissociates during the reaction.

BACKGROUND OF THE INVENTION

Thermal plasma processes use electricity as an energy source. For example, a gas is passed through an electric arc struck between an anode and a cathode or through a coil to which high frequency current is applied. This electrical energy is converted to thermal energy, as the gas is heated when it passes through the arc discharge or through the inductive coupling. The heated gas is useful as an energy carrier for a subsequent chemical reaction. Among the advantages of using electricity as a thermal energy source is that extremely high temperatures (higher than normal combustion temperatures) can be obtained in the gas and combustion products can be avoided. Devices that transfer electrical energy to thermal energy in this manner are sometimes called plasma heaters. Plasma heaters are available that provide gas temperatures up to about 20,000° K. Gas in the heater is in a partially ionized plasma state of being electrically conductive but still retaining electrical neutrality. This plasma state lasts for a short distance downstream of the heater exit before the electrons and ions recombine as the hot gasses cool. Among commercially available heaters are inductively coupled plasma torches (providing gas temperatures up to about 10,000° K.), welding torches, and the like.

A variety of plasma based processes are known or are in various stages of development. Thus, for example, Herman, *Scientific American.* pp. 112–117 (September 1988) describes plasma-sprayed coatings of ceramics, metals and polymers in air or in vacuum. Vukanovic et al., U.S. Pat. No. 4,505,947, issued Mar. 19, 1985 describes coating methods utilizing an arc plasma described as a non-local thermal equilibrium plasma said to be useful for depositing silicon and other semiconductor materials onto substrates.

Plasma processes may be generally viewed as either thermal, or high pressure, processes or cold, low pressure, processes. Low pressure processes are operated at sub-atmospheric pressures, typically in the range of about 1 Torr. For example, the etching of semiconductor material in VLSI circuit manufacture is by means of a cold plasma process. However, low pressure processes, when used to deposit a reaction product, tend to have relatively low deposition rates.

A typical plasma processing system contains a power supply (either AC or DC), a plasma heater (such as a torch), a reactor downstream of the heater, a plasma gas delivery system, a reactant feed system, a product collection system, a coolant system, and a control system.

Plasma processing has been suggested for the production of silicon by the reduction of $SiCl_4$, Coudert et al., *Plasma Processing and Plasma Chemistry,* Volume 2, No. 4, pp. 399–419 (1982). At sufficiently high temperatures, the chlorine atoms will be removed from the silicon tetrachloride molecule and recombined with hydrogen to form hydrochloric acid.

Another use of plasma has been to deposit diamond from a hydrogen and hydrocarbon mixture gas. U.S. Pat. No. 4,434,188, issued Feb. 28, 1984, inventors Tamo et al., describes a method for synthesizing diamond where a plasma is generated at a pressure from 0.05 to 400 Torr by microwave discharge. The plasma is formed from a mixture of hydrocarbon and hydrogen gasses carried by an unactive gas such as argon. U.S. Pat. No. 4,717,622, issued Jan. 5, 1988, inventors Purokawa et al. describes a plasma process conducted at low pressure (10–100 Pa, or 7.5–75 Torr) in which a plasma created by exciting a mixture of hydrocarbon and argon gasses is blown onto a substrate, such as a magnetic recording medium, to deposit a high hardness carbon. In a report of symposium proceedings held Aug. 31 through Sept. 4, 1987 was described the preparation of microcrystals and microcrystalline films of diamond on molybdenum substrates in a rf induction thermal plasma by using an argon-hydrogen-methane mixture under 1 atmosphere pressure. *ISPC/TOKYO 1987, Vol.* 4, Matsumoto et al., pp. no. S7-03.

However, the deposition rates of the known plasma processes involving dissociation, or decomposition, of a multiatomic reactant have tended to be disappointing and the quality of films deposited is not always satisfactory.

SUMMARY OF THE INVENTION

It is an object of the present invention to provide a high temperature plasma for use in the chemical dissociation of various multiatomic species, which has enhanced properties, such as increased deposition rates.

In one aspect of the present invention, a method for enhancing a chemical reaction is provided by forming a plasma that includes a multiatomic reactant, flowing the plasma into a reaction zone, and then elevating an electron temperature of the plasma by at least about 1000° Kelvin. The elevated electron temperature increases the dissociation of the multiatomic reactant in the plasma and/or inhibits recombination of the multiatomic reactant when dissociated. As a consequence, chemical reactions are considerably enhanced, particularly chemical reactions in which the dissociation of a reactant, such as silicon tetrachloride or hydrocarbon, is a rate limiting step in the deposition of materials such as silicon and diamond.

BRIEF DESCRIPTION OF THE DRAWINGS

FIG. 1 is a schematic illustration of a plasma system with which the invention may be practiced;

FIG. 2 is a perspective view, partially broken away, of an element of a preferred plasma system;

FIG. 3 graphically illustrates plasma enhanced dissociation at a constant gas temperature;

FIG. 4 graphically illustrates plasma inhibited recombination with a decreasing gas temperature in the case of $O_2$;

FIG. 5 is similar to FIG. 4; and,

FIG. 6 graphically illustrates plasma inhibited recombination with a dcereasing gas temperature in the case of $H_2$.

DETAILED DESCRIPTION OF THE PREFERRED EMBODIMENTS

A number of researchers have described thermal plasmas used in plasma synthesis at atmospheric or soft-vacuum conditions in terms of thermodynamic equilibrium. That is, theoretical calculations of processes in plasma torches and downstream reactors typically rely on equilibrium assumptions.

By equilibrium is meant that the plasma can be entirely described by pressure and by temperature. By thermodynamic non-equilibrium is meant any situation where knowledge of the pressure and temperature is not adequate entirely to describe the system. For example, where the heavy particle temperature, or gas temperature, is different from the electron temperature of a plasma, then the plasma can be said to be in non-equilibrium. Some researchers have noted that a non-equilibrium condition may exist in high temperature plasmas. For example, electric fields can be sufficiently strong in plasma torches to elevate the electron temperature and the local rate of charged-particle generation. Diffusion from gardients in the electron density can result in redistribution of the electron concentration to produce an overpopulation of the electron density in colder regions. Collisional coupling with free electrons can transfer non-equilibrium to bound excited states. Where the electron temperature $T_e$ differs from the heavy particle temperature, then the electrical conductivity and the chemical reaction rate depend on $T_e$.

In short, whether a state of thermodynamic equilibrium exists or not as the plasma exits a plasma heater is not always clear, although most studies assume an equilibrium state for the plasma as it exits the plasma generating device. To the extent a state of non-equilibrium may exist as the plasma exits the heater, the degree of non-equilibrium would be modest.

In the present invention, non-equilibrium is purposely induced or exaggerated in a downstream reaction zone to augment, or enhance, reactivity by increasing the dissociation of a multiatomic reactant and/or by inhibiting recombination of such multiatomic species when dissociated. This is achieved by elevating the electron temperature of the plasma once exited the heater by at least about 1000° Kelvin.

The apparatus useful in the present invention to form a suitable plasma preferably operates at about atmospheric pressure which, by means of an electric arc or inductively coupled coil, produces the ionized gas consisting of neutral atoms and/or molecules, electrons and ions, and exhibits collective properties. The electrical discharge creating the plasma may be DC or AC. Suitable plasma torches for practicing the invention are known and commerically available. For example, an inductively coupled plasma torch capable of generating a plasma at atmospheric pressure up to temperatures of about 10,000° K. is available from Tafa Inc. (50 KW).

Turning to FIG. 1, a suitable plasma system 10 for practicing the invention preferably comprises a plasma heater 12, a gas supply system 14, a power supply 16, a coolant system 18 and a control system 20. Plasma heater 12 converts electrical energy into enthalpy when a gas from supply system 14 is passed through an electric arc struck between a cathode and an anode or through a coil to which high frequency current is applied. Suitable carrier gasses are monoatomic, inert and preferably are the noble gasses. Due to ready availability, argon is preferred. The plasma system 10 is conventional until the plasma flows from the heater 12 through exit 22 into reaction zone 24. Reaction zone 24 includes means 26 for elevating the electron temperature ($T_e$) of the plasma when within the reaction zone 24, preferably by at least about 1000° K. above the initial electron temperature when the plasma leaves the heater 12 at exit 22.

Turning to FIG. 2, elevating means 26 may be accomplished by establishing an electric field through the plasma in the reaction zone 24. Thus, elevating means 26 may include cathode 28 and anode 30 disposed within reaction zone 24 so that the plasma will pass through an electric field. Where the reactants in the plasma are in minor amounts (as will be further described for the deposition of diamond), then a sufficient electric current for elevating means 26 will be a few volts/cm. A substrate 32 is preferably removably positioned within reaction zone 24 to collect the reaction product deposited. Substrate 32 may be operatively associated with means 34 for controlling the temperature of reaction zone 24 and/or substrate 32 during operation of the plasma process. Temperature controlling means 34 may be used to heat or to cool reaction zone 24 and/or substrate 32.

In another preferred embodiment (not shown), substrate 32 may be a tube of electrically conductive material, constitutes the cathode of elevating means 26 and may be heated or cooled by flowing fluid therethrough.

In another embodiment, elevating means 26 may be accomplished by irradiating the plasma in the reaction zone with substantially coherent electromagnetic radiation, such as by an excimer laser operating in the blue to near ultraviolet (not shown).

As plasma flows from exit 22 into reaction zone 24, its initial gas temperature will fall very quickly. Elevating means 26 is disposed a distance downstream of heater 12 sufficient to permit the gas temperature to fall below about 7500° K. before the electron temperature is elevated. That is, elevating means 26 is adjacent the position where reaction is to occur. This fall in gas temperature is desirable, because otherwise the electron density of higher temperatures tends to make sufficient elevation of the electron temperature difficult.

Reactants, at least one of which is a multiatomic species, are fed into the plasma either downstream exit 22, illustrated by the dashed lines as feedstock inlet 36a, or alternatively may be supplied upstream exit 22, such as ted into plasma heater 12 as a part of gas supply system 14. The latter is preferred.

Where the reaction product desired is diamond or diamond-like carbon, then the reactants will be hydrocarbon and hydrogen. A particularly preferred hydrocarbon is methane, although other hydrocarbons may be used to produce carbon: ethane, propane, ethylene, acetylene and the like. Hydrogen is useful because when it dissociates in the plasma, then the atomic hydrogen assists in preventing graphite formation. Substrate materials conducive to diamond growth include molybdenum, tungsten, silicon and cubic boric nitride. The substrate is preferably heated during the depositing, such as to a temperature of about 1,000° C.

When utilizing methane and hydrogen to produce diamond or diamond-like carbon, then the plasma is preferably formed from about 1-15 mole % hydrogen and about 0.1 to about 1 mole % methane. However, it should be understood that the method is applicable to other plasma processes in which dissociation of a multiatomic reactant is necessary, particularly when such dissociation is a rate limiting step. Deposition rates on the order of from one to several microns per minute can be expected. While pressures of about atmospheric are preferred, somewhat higher pressures may be used, but sufficient elevation of $T_e$ becomes more difficult. Lower pressures than about atmospheric reduce the amount of materials that can be processed.

Calculations were performed to investigate conditions under which electron temperature non-equilibrium was expected to enhance the chemical reactivity of thermal plasmas. These calculations were performed for the dissociation of a diatomic species, and show that even moderate electric fields for $O_2$ or $H_2$ in argon give rise to significant electron temperature elevation and a notable enhancement of reaction rate in comparison with a control where there was no electron temperature elevation.

A numerical code was prepared which considers a flowing noble gas plasma containing molecular reactants. In the presence of an electric field the elevation of the electron temperature was calculated taking into account collisional energy-loss factors. In addition to "thermal" reactions resulting from heavy-particle collisions, the code permitted investigation of augmented chemical reactivity associated with three somewhat arbitrarily differentiated mechanism. These are: relatively energetic collisions between higher-temperature electrons and molecular species; specific processes which occur only in plasmas, such as dissociative recombination; and plasma-enhanced channels such as predissociation following electron impact excitation. The calculations also account for finite ionization/recombination rates of atomic and molecular species. System studies have indicated that pyrolysis steps (that is, molecular decomposition) are rate-limiting in a number of plasma synthesis processes.

The numerical code is one-dimensional in reaction time. That is, initial conditions were specified in terms of species concentrations, and an electric field, or equivalently, an electron temperature elevation being imposed at time zero. The effect of this non-equilibrium mechanism is followed as a function of reaction time—or distance downstream. Based on estimates of the relevant time constants, elevation of the electron temperature is assumed to occur instantaneously relative to the rates of ionization and reaction. Thus, begining at time zero, the calculations follow the rate of non-equilibrium ionization and the resulting non-equilibrium effects on chemical reactivity.

Calculations of molecular oxygen decomposition in a non-equilibrium plasma have been performed using the following reaction scheme:

| | | | |
|---|---|---|---|
| (1) | $O_2 + M$ | $\longleftrightarrow$ | $O + O + M$ |
| (2) | $O_2 + e$ | $\longleftrightarrow$ | $O + O + e$ |
| (3) | $Ar + e$ | $\longleftrightarrow$ | $Ar^+ + e + e$ |
| (4) | $O_2 + e$ | $\longleftrightarrow$ | $O_2^+ + e + e$ |
| (5) | $O + e$ | $\longleftrightarrow$ | $O^+ + e + e$ |
| (6) | $O_2^+ + e$ | $\longleftrightarrow$ | $O + O$ |
| (7) | $O_2 + e$ | $\longleftrightarrow$ | $O^- + O$ |
| (8) | $O^- + M$ | $\longleftrightarrow$ | $O + e + M$ |
| (9) | $O_2 + e$ | $\longleftrightarrow$ | $O_2^* + e$ |
| (10) | $O_2^*$ | $\longleftrightarrow$ | $O + O$ |

Here, M refers to any heavy particle third body, and $O_2^*$ denotes electronically excited $O_2$ in the predissociation process. In the calculations, both forward and reverse reactions were considered, with the ratio of the respective rate coefficients determined by detailed balance. Based on estimates of characteristic times, $O_2^+$, $O^-$, and $O_2^+$ were assumed to be in steady state. That is, the net rate of reaction (4) was set equal to the net rate of reaction (6) and correspondingly the net rates of reactions (8) and (10) were assumed to balance the net rates of reactions (7) and (9), respectively.

Reactions (3), (4) and (5) describe the non-equilibrium ionization/recombination mechanism. Reactions (1) and (2) account for the competition between heavy-particle dissociation of $O_2$ and electron-impact dissociation. Dissociative recombination, through reaction (6), provides a plasma-specific mechanism for the production of atomic oxygen, as does dissociative attachment through reaction (7) followed by (8). Predissociation in $O_2$ is represented by reactions (9) and (10).

In the case of $H_2$ dissociation, in addition to reaction (3), the following reactions were considered:

| | | | |
|---|---|---|---|
| (11) | $H_2 + M$ | $\longleftrightarrow$ | $H + H + M$ |
| (12) | $H_2 + e$ | $\longleftrightarrow$ | $H + H + e$ |
| (13) | $H_2 + e$ | $\longleftrightarrow$ | $H_2 + e + e$ |
| (14) | $H + e$ | $\longleftrightarrow$ | $H^+ + e + e$ |
| (15) | $H_2^+ + e$ | $\longleftrightarrow$ | $H + H$ |
| (16) | $H_2 + e$ | $\longleftrightarrow$ | $H^- + H$ |
| (17) | $H^- + M$ | $\longleftrightarrow$ | $H + e + M$ |

In the first example, for $O_2$ dissociation as shown in FIG. 3, the gas temperature is held at 3000° K. and the electron temperature is increased to 5750° K. at time zero. The electron mole fraction $X_e$ rises from its initially low value to a steady state in about 40 ms. The oxygen-atom concentration $XO(T_e)$ increases by about 50 percent as a result of non-equilibrium processes, eventually reaching a steady state at about 80 ms, where a balance is established between dissociation reactions caused by energetic electrons and losses to the lower-temperature heavy particles. The values $XO(T_g)$ and $XO_2(T_g)$ of the O and $O_2$ mole fractions that are calculated in the absence of electron-temperature elevation remain constant, as does the equilibrium value $XO_2$ (eq) evaluated at the gas temperature—which for this situation if identical to the finite-rate value $XO_2(T_g)$ in the absence of electron-temperature elevation.

Significant effects are caused by the relatively energetic electrons, even though the electron concentration is much less than that of the heavy particles. Depending on the situation, it is found that either relatively energetic electron-impact dissociation or dissociative attachment can dominate the enhanced dissociation rate—which can be more than a factor of 2 greater than in the absence of a discharge.

In the second case, shown in FIG. 4, the gas temperature decreases linearly from 5750° K. at time zero to about 2500° K. at 87 ms, with the electron temperature elevated to 6500° K. at time zero and held constant thereafter. In this situation, the oxygen is almost completely dissociated initially but recombines in the absence of electron temperature elevation. With the rather modest electron temperature prescribed, recombination in the non-equilibrium situation is much less than that otherwise caused by the gas-temperature decrease. (The finite heavy-particle recombination rate causes $XO_2(T_g)$ to be less than $XO_2$ (eq) even in the absence of electron-temperature elevation.) With the elevated electron temperature, the electron density (not shown in FIG. 4) has a calculated rise time somewhat less than half of that shown in FIG. 3; a steady state is maintained after this "ignition" period. Even more dramatic effects are observed for a lower gas temperature, as given in FIG. 5. Results similar to those shown in these figures are obtained when reactions in hydrogen are considered rather than in oxygen, as shown in FIG. 6.

Greater electron-temperature elevation produces more dramatic effects, and an elevation of $\geqq 1,000°$ K. is preferred. If the electron-temperature elevation is too little, then "ignition" will not occur for the residence times considered, and the non-equilibrium effects will be not nearly so significant.

Although the present invention has been described with reference to specific examples, it should be understood that various modifications and variations can be easily made by those skilled in the art without departing from the spirit of the invention. Accordingly, the foregoing disclosure should be interpreted as illustrative only and not to be interpreted in a limiting sense. The present invention is limited only by the scope of the following claims.

It is claimed:

1. A method for enhancing a chemical reaction during which a multiatomic reactant dissociates, comprising:

providing a plasma having an initial gas temperature and an initial electron temperature in a reaction zone, the initial gas temperature and the initial electron temperature being the same or within less than about 1,000° Kelvin of each other, the plasma including at least one multiatomic species; and, elevating the electron temperature of the plasma in the reaction zone by at least about 1,000° Kelvin above the initial electron temperature and the initial gas temperature to increase the dissociation of the multiatomic species or to inhibit recombination of the multiatomic species when dissociated.

2. The method as in claim 1 wherein the plasma includes hydrogen and hydrocarbon.

3. The method as in claim 1 wherein a substrate is positioned within the reaction zone.

4. The method as in claim 1 wherein the plasma is flowed into the reaction zone and the multiatomic species is introduced into the plasma upstream of the reaction zone.

5. The method as in claim 1 wherein the reaction zone is at about atmospheric pressure during the elevating.

6. The method as in claim 5 wherein the plasma is formed from a major amount of an inert gas and lesser amounts of a hydrocarbon and hydrogen.

7. The method as in claim 6 wherein the plasma is formed from between about 1 to about 15 mole % hydrogen, between about 0.1 to about 1 mole % methane, and the rest inert gas.

8. The method as in claim 7 wherein a substrate is removably positioned in the reaction zone, and diamond or diamond-like carbon is deposited thereon.

9. The method as in claim 1 wherein the elevating is by establishing an electric field through the plasma in the reaction zone.

10. The method as in claim 9 wherein a substrate is positioned in the reaction zone and is in electrical communication with the plasma during the elevating.

11. The method as in claim 10 further comprising controlling the substrate temperature during the elevating.

12. The method as in claim 1 wherein the elevating is by irradiating the plasma in the reaction zone with substantially coherent electromagnetic radiation.

13. A plasma deposition method comprising:
    (a) generating a plasma at about atmospheric pressure, the plasma formed from a monoatomic gas;
    (b) flowing the plasma into a reaction zone, the reaction zone including a substrate;
    (c) feeding reactants into the plasma during step (a) or step (b);
    (d) elevating an electron temperature of the plasma by at least about 1,000° Kelvin; and,
    (e) depositing a reaction product of the reactants onto the substrate.

14. The deposition method as in claim 13 wherein the plasma of step (a) has an initial gas temperature, and the initial gas temperature is permitted to fall within the reaction zone during the elevating of step (d).

15. The deposition method as in claim 13 wherein the reactants are hydrogen and methane.

16. The deposition method as in claim 15 wherein the reaction product is diamond or diamond-like carbon.

* * * * *